United States Patent
Muller, Jr. et al.

(12)

(10) Patent No.: US 6,313,682 B1
(45) Date of Patent: Nov. 6, 2001

(54) PULSE GENERATION CIRCUIT AND METHOD WITH TRANSMISSION PRE-EMPHASIS

(75) Inventors: Richard R. Muller, Jr., Malibu, CA (US); Stephen A. Cohen, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/457,235

(22) Filed: Dec. 8, 1999

(51) Int. Cl.[7] .................................................. H03K 3/00
(52) U.S. Cl. ................................................... 327/291
(58) Field of Search ................................ 327/100, 108, 327/112, 125, 131, 134, 137, 170, 172; 702/124, 291

(56) References Cited

U.S. PATENT DOCUMENTS

| | | | |
|---|---|---|---|
| 5,434,446 | 7/1995 | Hilton et al. | 257/503 |
| 5,842,155 | 11/1998 | Bryson et al. | 702/124 |
| 5,877,647 | * 3/1999 | Vajapey et al. | 327/391 |
| 6,054,879 | * 4/2000 | Meng | 327/170 |
| 6,130,563 | * 10/2000 | Pilling et al. | 327/111 |
| 6,137,322 | * 10/2000 | Ten Eyck | 327/379 |

OTHER PUBLICATIONS

Donald G. Fink, Donal christiansen, "Integrated–Circuit Design", *Electronics engineers' Handbook*, McGraw–Hill Book Company, Third Edition, pp. 8–53 to 8–54, 13–6 to 13–7, 13–23, 19–68.

Richard C. Dorf, "Communications", *The Electrical Engineering Handbook*, Second Edition, CRC Press and IEEE Press, pp. 1520, 1522.

* cited by examiner

Primary Examiner—My-Trang Nuton
(74) Attorney, Agent, or Firm—Koppel & Jacobs

(57) ABSTRACT

A shaped pulse generation circuit for applications such as automatic test equipment pin drivers employs an active feedback circuit that adds a pre-emphasis to the output pulses, thereby compensating for the effect of the transmission system between the pin driver and the device under test. Current pulses are applied to the pin driver output transistors in conjunction with the production of rising and falling output pulse edges to produce edge overshoots that are mitigated during pulse transit to the device under test. The driver circuit together with the pre-emphasis active feedback circuit can be integrated onto a single chip, with an additional programming circuit employed to control the amount of pre-emphasis.

43 Claims, 3 Drawing Sheets

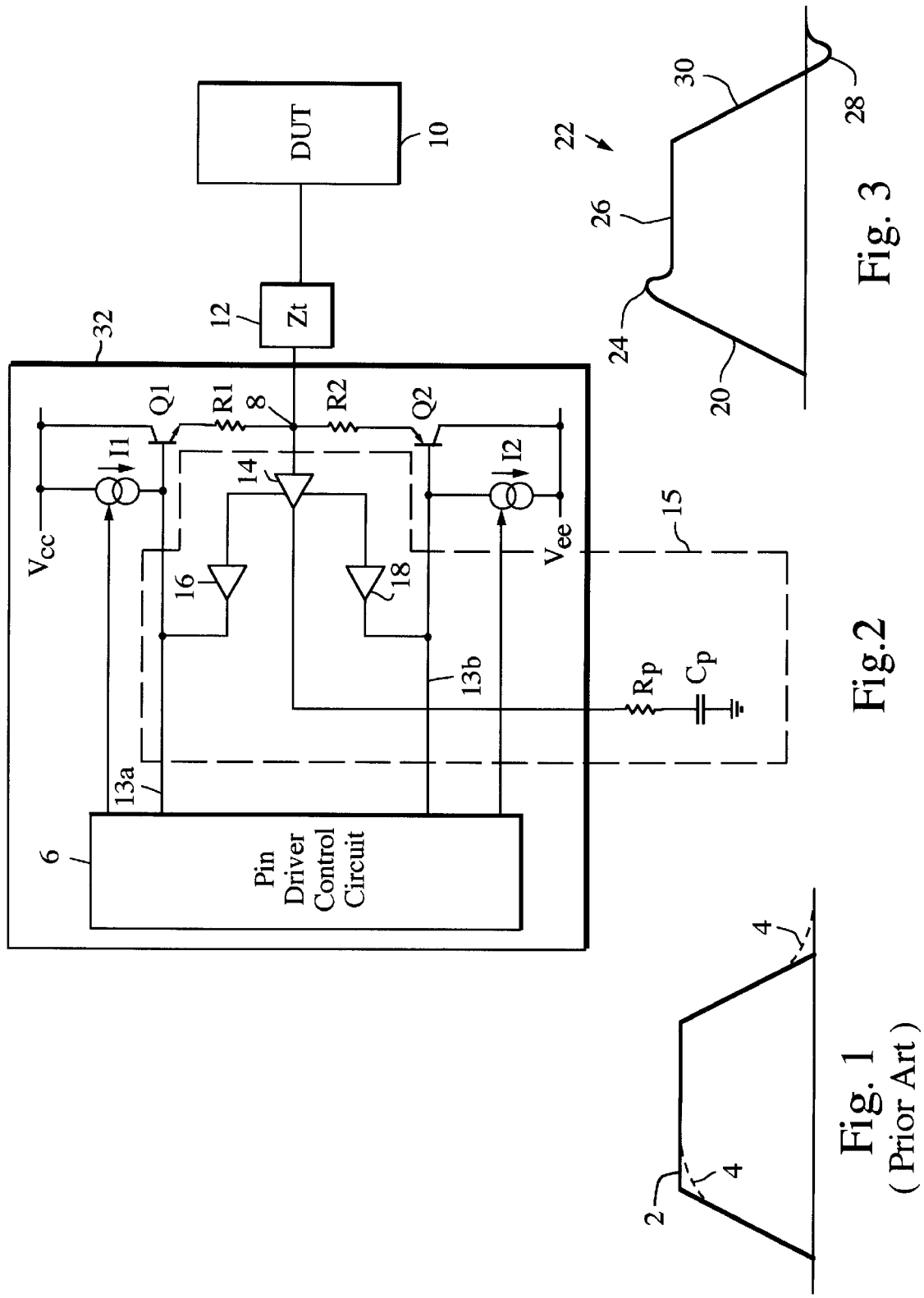

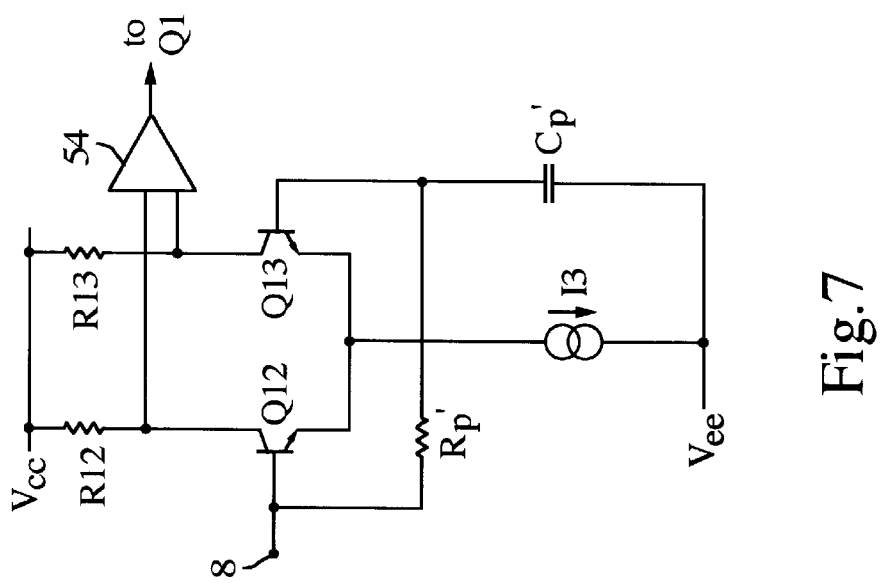
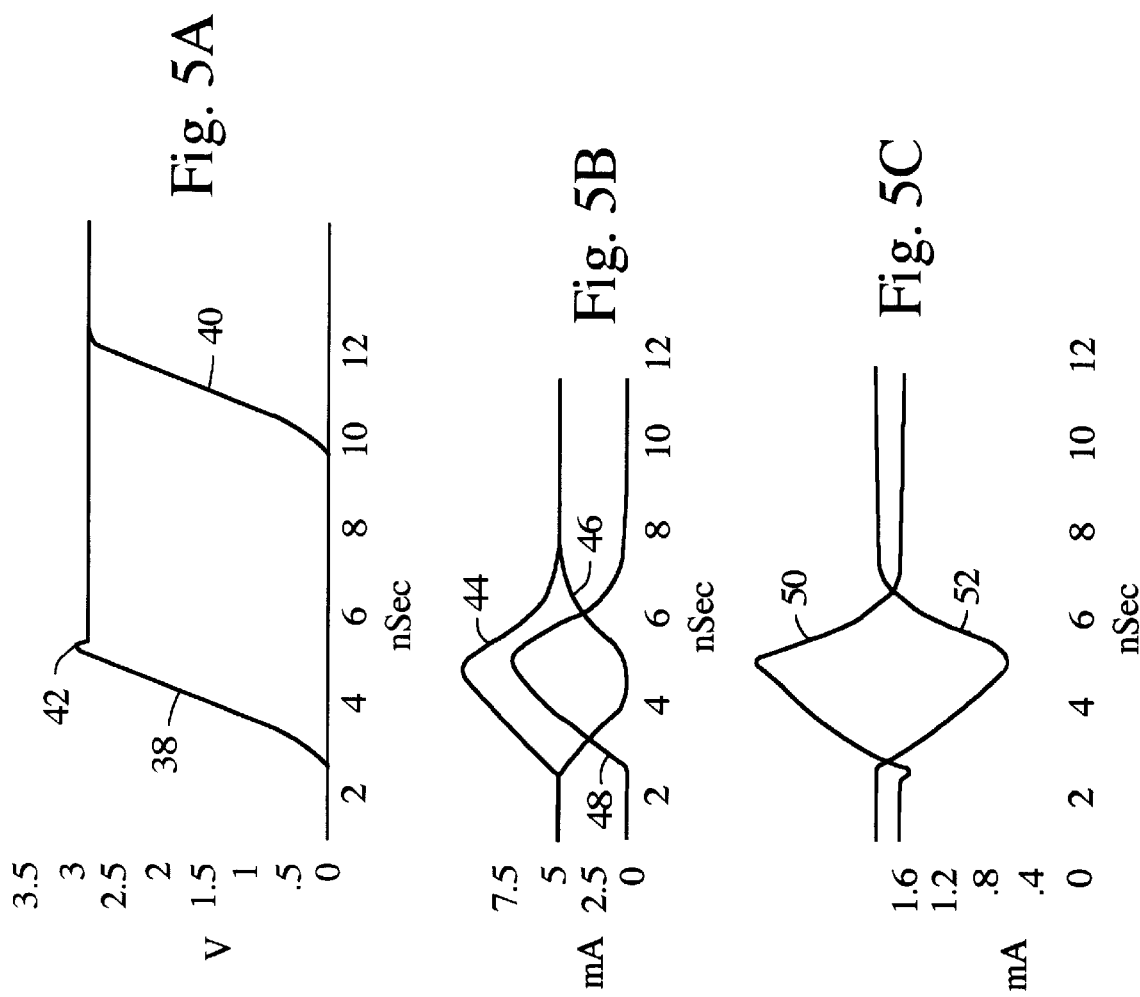

PULSE GENERATION CIRCUIT AND METHOD WITH TRANSMISSION PRE-EMPHASIS

BACKGROUND OF THE INVENTION

1. Field of the Invention

This invention relates to the generation and transmission of electrical pulses with desired waveforms, particularly in the context of automatic test equipment (ATE) pin drivers.

2. Description of the Related Art

Pin drivers are commonly used in automated test equipment systems to generate test signals in the form of digital or analog voltages for delivery to the input pins of a device under test (DUT). They may be used, for example, to test memory chips having many input pins. Proper waveshape and timing accuracy of the signal at the DUT-are primary objectives of the overall system design, and are figures of merit which distinguish between different available ATE systems.

Due to increasing system speeds, waveform fidelity has become harder to maintain. While a pin driver itself may be able to produce a pure, undegraded signal, various elements of the overall system have a detrimental effect on waveform fidelity. These include the board on which the pin driver is attached (commonly called the channel card), the relays used to direct the signal, and the connectors which transmit the signal to other boards. The large number of pins on test devices such as memory chips also leads to long signal paths. The net effect is to lower the bandwidth of the test pulse signals that are delivered to the DUT. Although the driver itself may produce crisp, clean pulses with sharp corners, the net effect of the signal path between the pin driver and the DUT is to round off the corners of the test pulses, causing the transitions between the pulse edges and the full scale pulse value to be slower and more gradual than is desired. This is illustrated in FIG. 1, in which the clean pulse 2 generated by the pin driver is indicated by a solid line, with the rounded corners 4 induced by the transmission system indicated by dashed lines.

Attempts to remediate the pulse degradation have typically been directed towards reducing the effects of the transmission system. For example, inductive tuning networks have been provided along the signal path to produce a ringing which compensates for the path's effect on the pulse shape. Another approach involves adding copper stubs to the circuit board with a characteristic impedance that matches that of the transmission elements. Efforts have also been made to develop improved relays whose effect on the final pulse delivered to the DUT is reduced. All of these approaches are directed at modifying the transmission system so as to reduce or compensate for its effects on the clean pulse, and require a significant modification to the channel card.

SUMMARY OF THE INVENTION

The present invention seeks to provide an improved way to deliver a sharp pulse signal to a DUT, without having to modify the transmission system or significantly impacting the channel card. It relies upon modifying the original pulse signal itself, rather than the transmission system, to generate the pulse with a pre-emphasis that compensates for the effects of the transmission system, so that the final pulse delivered to the DUT has a desired clean waveform.

The pre-emphasis is implemented with an active feedback circuit in the pulse forming circuitry that adds a pre-emphasis to the edges of the pulse, preferably causing leading and trailing edges of the pulse to overshoot by an amount that compensates for the rounding effect of the transmission system. The feedback circuit is preferably integrated together with the basic pulse forming circuit in a common integrated circuit (IC) chip, except for an off-chip circuit that is used to program the amount of pre-emphasis to be added.

In one embodiment the feedback circuit modifies the current drive to an output transistor from which the pulse is produced. It includes an amplifier that receives a feedback from the output pulse, and an RC circuit which causes the amplifier to produce a pre-emphasis current for the output transistor as an edge overshoot. A pair of amplifiers are preferably employed to provide positive and negative overshoots for the leading and trailing pulse edges.

These and other features and advantages of the invention will be apparent to those skilled in the art from the following detailed description, taken together with the accompanying drawings.

BRIEF DESCRIPTION OF THE DRAWINGS

FIG. 1 is a diagram, described above, illustrating an ideal voltage pulse and the distortion imparted by its transmission system;

FIG. 2 is a simplified schematic diagram of a pin driver system which incorporates the invention;

FIG. 3 is a diagram illustrating the nature of the pre-emphasis provided by the invention;

FIGS. 5A, 5B and 5C are graphs respectively illustrating an output voltage pulse waveform at various locations in the system, current waveforms generated internally within the pre-emphasis circuit, and current waveforms which induce the pre-emphasis output;

FIG. 7 is a schematic diagram of an alternate circuit for generating a pre-emphasis signal.

DETAILED DESCRIPTION OF THE INVENTION

Figures 4, 6:
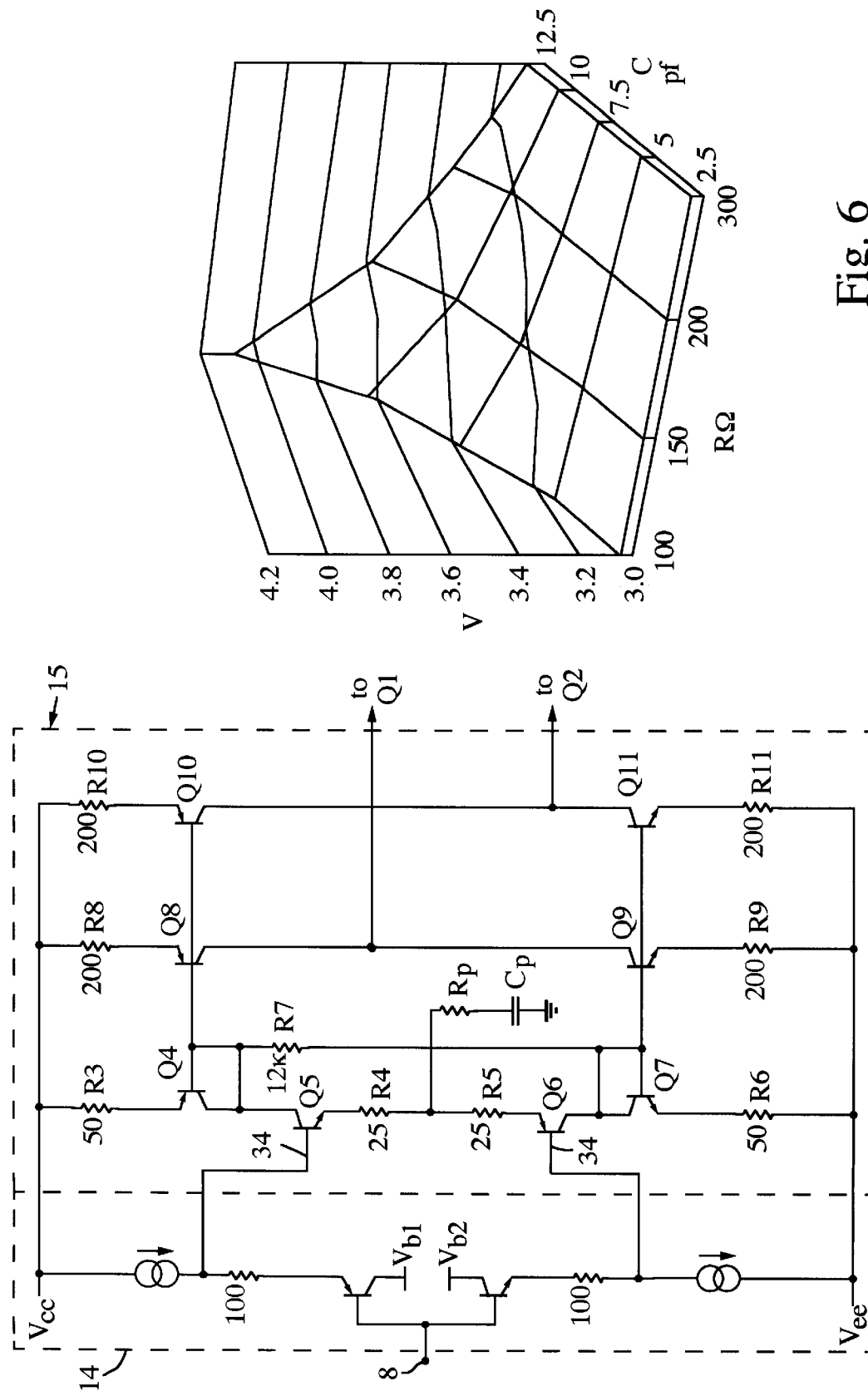
FIG. 4 is a schematic diagram of a feedback pre-emphasis circuit in accordance with the invention, together with a reverse buffer amplifier for the pin driver.
FIG. 6 is a 3-dimensional graph illustrating the pre-emphasis signal as a function of resistance and capacitance values in an RC programming circuit employed by the pre-emphasis circuitry.

FIG. 2 illustrates a pin driver system which incorporates the invention. It includes a pin driver with a control circuit 6 and an output stage. The pin driver can be an available device such as the Analog Devices, Inc. model AD53004. This device uses a class A-B ("push-pull") type output stage. An npn bipolar output transistor Q1 and an output resistor R1 are connected in series between a positive voltage reference Vcc and an output node 8 on the "push" or positive side of the output stage, while another output resistor R2 and pnp bipolar output transistor Q2 are connected in series between node 8 and a negative voltage reference Vee on the "pull" or negative side of the output stage. A current source I1 controlled by one output of the pin driver control circuit 6 drives current into the base of Q1, while another current source I2 controlled by another output of the pin driver control circuit draws current out of the base of Q2. Vcc and Vee are typically +10 volts and −5.2 volts, respectively. The current sources are typically 15 mA, and the output resistors 4 ohms. The output node 8 provides test pulses to a DUT 10 through a transmission system 12 which typically includes relays, cabling and connectors, the collective impedance of which is represented by Zt.

A voltage which establishes a high reference level (level 26 in FIG. 3, discussed below) during the "push" phase of operation is provided in the base of Q1 over output line 13a from the pin driver control circuit. Similarly, a voltage which establishes a low reference level (ground voltage in FIG. 3) during the "pull" phase of operation is provided to the base of Q2 over output line 13b from the pin driver control circuit.

To initiate a positive pulse, the pin driver control circuit 6 causes I1 to transmit current into the base of Q1, which in turn causes the base voltage to rise. Functioning as an emitter follower, the emitter voltage of Q1 also rises, bringing up the voltage at the output node 8. To reduce the output voltage, the pin driver control circuit 6 causes I2 to draw current out of the base of Q2, in turn causing Q2's base voltage and thus its emitter voltage to drop, along with the voltage at output node 8.

The output node is connected via a known unity gain reverse buffer amplifier 14 to pre-emphasis feedback circuitry which is the subject of the invention. A suitable reverse buffer amplifier is discussed as element 106 in U.S. Pat. No. 5,434,446 to Hilton et al., "Parasitic Capacitance Cancellation Circuit".

The reverse buffer amplifier 14 is part of a feedback circuit 15 which includes a pair of voltage-to-current converting amplifiers 16 and 18 connected to dual outputs of the reverse buffer amplifier. Amplifier 16 responds to a rising voltage at the output node 8 (which produces an equal rising voltage at the output of unity gain reverse buffer amplifier 14) by producing an output current that adds to the current drive from I1 into the base of output transistor Q1. This causes the voltage rise at the base and emitter of Q1, and also at the output node 8, to transiently overshoot the value that would be reached from the current drive supplied from I1 by itself. Thus, as illustrated in FIG. 3, the leading edge 20 of an output voltage pulse 22 at output voltage node 8 will spike to a peak overshoot level 24 that is greater than the maximum pulse level 26 due to I1. Similarly, amplifier 18 responds to a falling voltage at output node 8 to produce a transient boost in the current drawn out of the base of output transistor Q2, causing an overshoot 28 in the trailing edge 30 of output pulse 22 to a level less than that due solely to I2.

The overshoots 24 and 28 constitute a pre-emphasis of the ideal pulse waveform 2 in FIG. 1 that compensates for the effects of the pulse transmission system, yielding a much closer approximation of the ideal waveform for the pulse that is actually applied to the DUT after transmission through the pulse transmission system 12. The amount of overshoot is programmed into the system by means of a programming element, which in the illustrated embodiment is shown as an RC circuit consisting of resistor Rp and capacitor Cp in series between the output of the feedback circuit and ground. The magnitude of over-shoot can be adjusted, to the first order, simply by changing the resistance value, while its duration is established by the RC time constant. Alternate programming circuits, such as an RLC circuit or an active cell that produces a desired waveshape, could be used instead of an RC circuit.

One of the distinct advantages of the invention is that the pre-emphasis feedback circuit can be integrated in common with the pin driver on a common substrate, illustrated as IC chip 32 in FIG. 2. The feedback amplifiers 16, 18 employ active transistor elements that can be integrated with the remainder of the pin driver circuitry in a single IC chip. The only elements that would normally be off-chip would be the components of the programming circuit. This is advantageous, since different programming component values might be desired for the same type of pin driver chip in different situations; these values can be optimized for each individual application. However, the programming circuit can be on-chip if desired.

FIG. 4 is a schematic diagram showing one implementation of a pre-emphasis feedback circuit 15, including a simplified reverse buffer amplifier 14 for which typical ohmic resistance values are given. The reverse buffer amplifier is a push-pull emitter follower unity gain buffer. It receives a voltage input from the driver circuit's output node 8, and produces corresponding output voltages on lines 34 and 36.

The pre-emphasis circuit 15, much like the push-pull portion of the driver output stage, includes a positive current drive section consisting of a resistor R3, a diode-connected transistor Q4, a drive transistor Q5 and another resistor R4 connected in that order between Vcc and the RpCp circuit. Similarly, a negative current drive circuit is included consisting of a resistor R5, a drive transistor Q6, a diode-connected transistor Q7 and another resistor R6 connected in that order between the RpCp circuit and Vee. A high value resistor R7 is connected between the common base-collector terminals for Q4 and Q7 to maintain a standing current of about 1 mA, which prevents Q5 and Q6 from turning completely off during a transition. The Q5 and Q6 drive transistors are respectively npn and pnp bipolar devices whose bases are driven respectively by voltage outputs 34 and 36 from the reverse buffer amplifier 14. In response to a positive going signal on drive line 34, Q5 develops a dynamic current spike in excess of its quiescent current (typically about 4–5 mA), with a magnitude and shape that are determined by the selected values for Rp and Cp; during this time the voltage on drive line 36 changes in tandem with that on drive line 34, reducing the current through negative drive Q6. Conversely, a negative going pin driver output voltage on output node 8 produces a negative going drive voltage on line 36 that causes Q6 to conduct a dynamic negative current spike, the magnitude and duration of which are again determined by the selected values for Rp and Cp.

The currents through drive transistors Q5 and Q6 pass through diode-connected transistors Q4 and Q7, re-spectively, from which they are mirrored to inject the pre-emphasis base current spikes into the pin driver out-put transistors Q1 and Q2. The first mirror leg consists of series connected pnp and npn transistors Q8 and Q9, whose bases are connected in common with the bases of current drive transistors Q4 and Q7, respectively, and whose emitters are respectively connected to Vcc and Vee through resistors R8 and R9. The second mirror leg is identical to the first, including transistors Q10 and Q11 and resistors R10 and R11, which correspond respectively to Q8, Q9, R8 and R9. An input to Q1 is taken from the collectors of Q8 and Q9 in the first mirror leg, and an input to the base of Q2 from the collectors of Q10 and Q11 in the second mirror leg. In this particular embodiment the resistance values of R8 and R10 in the upper mirror legs are greater than that of R3 in the mirror drive circuit, and similarly the resistance values of R9 and R11 in the lower mirror legs are greater than that of R6 in the mirror drive circuit, to yield lower reflected currents in the mirror legs than in the mirror drive. Depending upon the particular application, other resistor ratios may be employed.

In response to a positive going leading pulse edge on input lines 34 and 36 to the pre-emphasis circuit, npn current drive transistor Q5 conducts a current spike governed by the RpCp programming circuit. Since Cp will initially appear as a short circuit, a sharp rise in current will occur, followed by a rapid reduction back to zero as Cp charges. The Q5 current spike also flows through Q4, from where it is mirrored into Q8 and Q10 in a proportion determined by the transistor sizes and resistor ratios. The current through Q6 and Q7 decreases, and is mirrored into Q9 and Q11. Accordingly, a positive pre-emphasis current spike is sent to the high impedance bases of the pin driver output transistors Q1 and Q2 from the first and second mirror legs. Since npn transistor Q1 is conducting, the current spike increases its base and emitter voltages to produce a corresponding positive pre-emphasis voltage (corresponding to pre-emphasis 24 in FIG. 3) in the output voltage pulse that is delivered through the pulse transmission system 12 to the DUT 10.

Conversely, a negative going trailing edge voltage on input lines 34 and 36 to the pre-emphasis circuit reduces the current through Q5 and increases the current through Q6. This activates the lower portion of the current mirror, causing mirror leg transistors Q9 and Q11 to draw pre-emphasis current pulses out of the bases of Q1 and Q2. The result is a transient reduction in the voltage at pin driver output node 8, corresponding to negative pre-emphasis overshoot 28 at the end of the trailing pulse edge in FIG. 3. Again, the magnitude and duration of this negative overshoot is governed by the values of Rp and Cp.

With the circuit shown in FIG. 4, the necessary current spike into the high impedance output transistor base to effect a 5% overshoot is about 3 mA. To cancel out the quiescent current through Q5 and Q6, the collectors of Q8 and Q9 and of Q10 and Q11 are connected together. The resulting current out to the output transistors is only the difference during transients, plus a small error term.

The current through the external RpCp circuit needs to be balanced with the pre-emphasis current required for the driver output stage, while maintaining a minimum preemphasis pulse width and keeping all transistors in the forward active region. In one implementation Rp was set at 250 ohms and Cp at 3 pF. The value of Rp establishes the amplitude of the pre-emphasis current, while the RpCp time constant sets its duration. Overshoots of 6.8%–7.9% were simulated for various circuit fabrication processes for a 3 volt rising edge, and 4.8%–6.9% for the trailing falling edge.

The durations of the pin driver rising and falling edges are relatively long; a slew rate of 2.4V/1.7 nsec is typical. By contrast, the reaction time of the preemphasis circuit is quite rapid, typically a few hundred psec. This allows for an effective feedback circuit that adds timely overshoots to pin driver pulse edges.

Illustrations of the output voltage pulse that would be produced with the circuit described above, at the output node 8 (trace 38) and at the DUT 10 (trace 40), are shown in FIG. 5A for a rising pulse edge; the circuit's response to a falling pulse edge would be a mirror image. A distinct pre-emphasis spike 42 can be observed on top of the leading rising pulse edge at the pin driver output node 8. This spike is substantially eliminated, through the effect of the transmission network, in the final pulse delivered to the DUT. The pulse at the DUT has a sharper corner than the pulse that would result in the absence of the invention's pre-emphasis. A similar improvement is produced in the trailing pulse edge.

FIG. 5B illustrates the positive current spike 44 through resistor R4, and the reduction in current flow 46 through resistor R5 in response to a rising voltage edge at the input to the pre-emphasis circuit. The resulting current spike into the RpCp programming circuit is indicated by trace 48.

FIG. 5C indicates the reflected currents in the first mirror leg that flow through upper transistor Q8 (trace 50) and the lower transistor Q9 (trace 52) in response to the currents 44 and 46 through the mirror drive leg, respectively. The difference between these currents is supplied to the pin driver output transistor Q1 to add a positive voltage overshoot to a rising output pulse edge. The current magnitudes in the mirror legs, illustrated in FIG. 5C, are reduced from the current magnitudes in the drive leg, illustrated in FIG. 5B, due to the resistor ratioing of the mirror. The circuit's response to a falling pulse edge is complementary to its response, described above, to a rising edge.

A 3-dimensional plot of the overshoot percentage as a function of both Rp and Cp is presented in FIG. 6. It can be seen that, for a constant capacitance value, the overshoot percentage increases with falling resistance. Since the programming capacitor Cp initially appears as a short circuit to an output pulse transient, the magnitude of the output pulse overshoot will be scaled inversely to the value of Rp.

While a particular embodiment of the invention has been shown and described, numerous variations and alternate embodiments will occur to those skilled in the art. For example, alternate ways to generate a pre-emphasis could be used, such as the phase controlled differential transistor pair shown in FIG. 7. In this circuit, instead of the feedback circuit described above, a pair of differentially connected transistors Q12 and Q13 with respective load resistors R12 and R13 receive base inputs from the pin driver's output node 8, with a current source I3 pulling current from the transistors' emitters. A programming circuit, consisting of resistor Rp' connected between the bases of Q12 and Q13 and capacitor Cp' connected between the base of Q13 and ground, establishes a time constant for the voltage rise at the base of Q13. A differential current amplifier 54 amplifies the current differential between the collectors of Q12 and Q13, and provides a current output to the base of Q1. The base voltage of Q1 rises rapidly in response to a rapidly rising pulse edge at the pin driver output node 8, while the base voltage of Q13 rises more gradually because of the Rp' Cp' circuit. This produces a transient differential between the emitter currents for Q12 and Q13 that is amplified by amplifier 54 to yield a pre-emphasis current pulse for Q1. This current can be mirrored to provide a pre-emphasis for Q2 also. Accordingly, it is intended that the invention be limited only in terms of the appended claims.

We claim:

1. A shaped pulse generation circuit, comprising:
   a pulse forming circuit arranged to produce an electrical output pulse having a pulse shape as an output, and
   an active feedback circuit connected to provide an active feedback path between said output and said pulse forming circuit,
   said feedback circuit changing the shape of said output pulse compared to the pulse shape that would be produced in the absence of said feedback circuit and, together with said pulse forming circuit, presenting a constant output impedance.

2. The shaped pulse generation circuit of claim 1, wherein said feedback circuit provides pre-emphasis to said output pulse.

3. The shaped pulse generation circuit of claim 2, wherein said feedback circuit responds to an edge of said output pulse to provide said pre-emphasis as an edge overshoot.

4. The shaped pulse generation circuit of claim 3, wherein said feedback circuit responds to both leading and trailing edges of said output pulse to provide respective overshoots to said edges.

5. The shaped pulse generation circuit of claim 3, wherein said feedback circuit is programmable to control the amount of said pre-emphasis.

6. The shaped pulse generation circuit of claim 1, wherein said pulse forming circuit drives an output transistor to produce said output pulse, and said feedback circuit modifies the output transistor drive.

7. The shaped pulse generation circuit of claim 6, wherein said pulse forming circuit provides a current drive to said output transistor, and said feedback circuit adds a pre-emphasis current to said output transistor current drive.

8. The shaped pulse generation circuit of claim 1, said pulse forming circuit comprising a pin driver for automated test equipment.

9. A shaped pulse generation circuit, comprising:
  a pulse forming circuit arranged to produce an electrical output pulse having a pulse shape as an output, and
  an active feedback circuit connected to provide an active feedback path between said output and said pulse forming circuit,
  said feedback circuit changing the shape of said output pulse compared to the pulse shape that would be produced in the absence of said feedback circuit by providing pre-emphasis to said output pulse, said feedback circuit responding to an edge of said output pulse to provide said pre-emphasis as an edge overshoot,
  said feedback circuit including a pre-emphasis programming element and, except for said programming element, being integrated together with said pulse forming circuit in a common integrated circuit chip.

10. The shaped pulse generation circuit of claim 9, wherein said programming element is off-chip.

11. A shaped pulse generation circuit, comprising:
  a pulse forming circuit arranged to produce an electrical output pulse having a pulse shape as an output, and
  an active feedback circuit connected to provide an active feedback path between said output and said pulse forming circuit,
  said feedback circuit changing the shape of said output pulse compared to the pulse shape that would be produced in the absence of said feedback circuit,
  said pulse forming circuit providing a current drive to an output transistor to produce said output pulse, and said feedback circuit modifying the output transistor drive by adding a pre-emphasis current to said output transistor current drive,
  said feedback circuit comprising an amplifier connected to receive a signal indicative of the output pulse, and an RC circuit connected to cause said amplifier to produce said pre-emphasis current as an edge overshoot for said output pulse.

12. The shaped pulse generation circuit of claim 11, said amplifier comprising a pair of amplifiers connected to provide positive and negative overshoots for leading and trailing edges, respectively, of said output pulse.

13. A shaped pulse generation circuit, comprising:
  a pulse forming circuit arranged to produce electrical pulses as an output, and
  a pre-emphasis circuit connected to pre-emphasize edges of said output pulses by causing them to overshoot, said pre-emphasis circuit together with said pulse forming circuit presenting a constant output impedance.

14. The shaped pulse generation circuit of claim 13, wherein said pre-emphasis circuit responds to both rising and falling edges of said output pulses to provide respective overshoots to said edges.

15. The shaped pulse generation circuit of claim 13, wherein said pre-emphasis circuit is programmable to adjust the amount of said pre-emphasis.

16. The shaped pulse generation circuit of claim 13, wherein said pulse forming circuit drives an output transistor to produce said output pulses, and said pre-emphasis circuit pre-emphasizes a drive signal to said output transistor.

17. The shaped pulse generation circuit of claim 13, said pulse forming circuit comprising a pin driver for automated test equipment.

18. A shaped pulse generation circuit, comprising:
  a pulse forming circuit arranged to produce electrical pulses as an output, and
  a pre-emphasis circuit connected to pre-emphasize edges of said output pulses by causing them to overshoot,
  wherein said pre-emphasis circuit includes a pre-emphasis programming element and, except for said programming element, is integrated together with said pulse forming circuit in a common integrated circuit chip.

19. The shaped pulse generation circuit of claim 18, wherein said programming element is off-chip.

20. A method of delivering an electrical pulse through a pulse-distorting transmission system so that it has a desired non-pre-emphasized pulse shape after transmission, comprising:
  generating a pre-emphasized pulse having a pulse shape which is pre-emphasized to compensate for the distortion of said transmission system, and
  transmitting said pulse through said transmission system to yield an output pulse from said transmission system with said desired non-pre-emphasized shape.

21. The method of claim 20, wherein said pre-emphasized pulse is generated by generating initial pulse edges with said desired shape, and operating upon said edges to produce said pre-emphasized pulse.

22. The method of claim 21, wherein said initial pulse edges are operated upon by sensing them, generating in response to the initial pulse edges thus sensed, and adding said to the sensed edges.

23. The method of claim 22, wherein both leading and trailing edges of said initial pulse are sensed, and overshoots of opposite sign are generated and added to respective ones of said edges.

24. The method of claim 22, wherein said initial pulse edges are generated by controlling the current drives of output transistors to produce an output voltage, sensing said output voltage, generating overshoot currents in response to the sensed output voltage, and adding said overshoot currents to the transistor drives to impart said desired pulse shape to said output voltage.

25. The method of claim 20, wherein said pre-emphasized pulse is generated by an automated test equipment pin driver and transmitted through said transmission system to a device under test.

26. A shaped pulse delivery system, comprising:
  an electrical signal transmission system that imparts a distortion to signals which it transmits, and
  a shaped electrical pulse generation circuit that is connectable to apply a pulse to said signal transmission system, said pulse generation circuit comprising:
    a pulse forming circuit arranged to produce an electrical pulse as an output, and
    an active feedback circuit connected to provide an active feedback path between said output and said pulse forming circuit, said feedback circuit establishing said output pulse with a pulse shape that is pre-emphasized to compensate for the distortion of said transmission system, so that said pulses have a desired non-pre-emphasized shape when delivered from said transmission system.

27. The shaped pulse delivery system of claim 26, wherein said feedback circuit responds to an edge of said output pulse to provide said pre-emphasis as an edge overshoot.

28. The shaped pulse delivery system of claim 26, wherein said feedback circuit responds to both leading and trailing edges of said output pulse to provide respective overshoots to said edges.

29. The shaped pulse delivery system of claim 26, wherein said pulse forming circuit drives an output transistor to produce said output pulse, and said feedback circuit modifies a drive signal to said output transistor.

30. The shaped pulse delivery system of claim 29, wherein said pulse forming circuit provides a current drive to said output transistor, and said feedback circuit adds a pre-emphasis current to said output transistor current drive.

31. The shaped pulse delivery system of claim 26, said pulse forming circuit comprising a pin driver for automated test equipment, and said transmission system transmitting said pulse to a device under test.

32. The shaped pulse delivery system of claim 26, said pulse generating circuit presenting a constant output impedance.

33. A shaped pulse delivery system, comprising:
an electrical signal transmission system that imparts a distortion to signals which it transmits, and
a shaped electrical pulse generation circuit that is connectable to apply a pulse to said signal transmission system, said pulse generation circuit comprising:
a pulse forming circuit arranged to produce an electrical pulse as an output, and
an active feedback circuit connected to provide an active feedback path between said output and said pulse forming circuit, said feedback circuit establishing said output pulse with a desired pulse shape that is pre-distorted to compensate for the distortion of said transmission system,
wherein said feedback circuit includes a pre-emphasis programming element, responds to an edge of said output pulse to provide pre-emphasis to said output pulse as an edge overshoot and, except for said pre-emphasis programming element, is integrated together with said pulse forming circuit in a common integrated circuit chip.

34. The shaped pulse delivery system of claim 33, wherein said programming element is off-chip.

35. A shaped pulse delivery system, comprising:
an electrical signal transmission system that imparts a distortion to signals which it transmits, and
a shaped electrical pulse generation circuit that is connectable to apply a pulse to said signal transmission system, said pulse generation circuit comprising:
a pulse forming circuit circuit arranged to produce an electrical pulse as an output, and
an active feedback circuit connected to provide an active feedback path between said output and said pulse forming circuit, said feedback circuit establishing said output pulse with a desired pulses shape that is pre-distorted to compensate for the distortion of said transmission system,
said pulse forming circuit providing current drive to an output transistor to produce said output pulse, and said feedback circuit modifying a drive signal to said output transistor by adding a pre-emphasis current to said output transistor current drive,
said feedback circuit comprising an amplifier connected to receive a signal indicative of the output pulse, and an RC circuit connected to cause said amplifier to produce said pre-emphasis current as an edge overshoot for said output pulse.

36. The shaped pulse delivery system of claim 35, said amplifier comprising a pair of amplifiers connected to provide positive and negative overshoots for leading and trailing edges, respectively, of said output pulse.

37. A shaped pulse delivery system, comprising:
an electrical signal transmission system that imparts a distortion to signals which it transmits, and
a shaped electrical pulse generating circuit that is connectable to apply pulses to said signal transmission system, said pulse generation circuit comprising:
a pulse forming circuit arranged to produce electrical pulses as an output, and
a pre-emphasis circuit connected to pre-emphasize edges of said output pulses by causing them to overshoot sufficiently to compensate for said distortion, so that said pulses have a desired non-pre-emphasized shape when delivered from said transmission system.

38. The shaped pulse delivery system of claim 37, wherein said pre-emphasis circuit responds to both rising and falling edges of said output pulses to provide respective overshoots to said edges.

39. The shaped pulse delivery system of claims 37, wherein said pulse forming circuit drives an output transistor to produce said output pulses, and said pre-emphasis circuit pre-emphasizes the output transistor drive.

40. The shaped pulse delivery system of claim 37, said pulse forming circuit comprising a pin driver for automated test equipment, and said transmission system transmitting said pulse to a device under test.

41. The shaped pulse delivery system of claim 37, said pulse generating circuit presenting a constant output impedance.

42. A shaped pulse delivery system, comprising:
an electrical signal transmission system that imparts a distortion to signals which it transmits, and
a shaped electrical pulse generating circuit that is connectable to apply pulses to said signal transmission system, said pulse generation circuit comprising:
a pulse forming circuit arranged to produce electrical pulses as an output, and
a pre-emphasis circuit connected to pre-emphasize edges of said output pulses by causing them to overshoot sufficiently to compensate for said distortion, so that said pulses have a desired non-pre-emphasized shape when delivered from said transmission system,
wherein said pre-emphasis circuit includes a pre-emphasis programming element and, except for said programming element, is integrated together with said pulse forming circuit in a common integrated circuit chip.

43. The shaped pulse delivery system of claim 42, wherein said programming element is off-chip.

* * * * *